(12) United States Patent
Zhou et al.

(10) Patent No.: US 9,767,879 B2
(45) Date of Patent: Sep. 19, 2017

(54) SETTING OF REFERENCE VOLTAGE FOR DATA SENSING IN FERROELECTRIC MEMORIES

(71) Applicant: Texas Instruments Incorporated, Dallas, TX (US)

(72) Inventors: Carl Z. Zhou, Plano, TX (US); Keith A. Remack, Richardson, TX (US); John A. Rodriguez, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/019,026

(22) Filed: Feb. 9, 2016

(65) Prior Publication Data
US 2016/0240238 A1   Aug. 18, 2016

Related U.S. Application Data

(60) Provisional application No. 62/116,977, filed on Feb. 17, 2015.

(51) Int. Cl.
*G11C 11/22*   (2006.01)
*G11C 29/02*   (2006.01)
*G11C 29/50*   (2006.01)

(52) U.S. Cl.
CPC .......... *G11C 11/221* (2013.01); *G11C 29/028* (2013.01); *G11C 29/50016* (2013.01); *G11C 11/2273* (2013.01); *G11C 11/2275* (2013.01); *G11C 29/50* (2013.01)

(58) Field of Classification Search
CPC .................................. G11C 11/5642
USPC .......................................................... 365/145
See application file for complete search history.

(56) References Cited

U.S. PATENT DOCUMENTS

| | | | |
|---|---|---|---|
| 7,149,137 B2 | 12/2006 | Rodriguez et al. | |
| 7,813,193 B2 | 10/2010 | Rodriguez et al. | |
| 8,023,308 B1* | 9/2011 | Evans, Jr. | G11C 11/22 365/145 |
| 2001/0015925 A1* | 8/2001 | Camera | G11C 29/50 365/201 |

(Continued)

OTHER PUBLICATIONS

Eshita et al., "Development of ferroelectric RAM (FRAM) for mass production", Applications of Ferroelectrics, International Workshop on Acoustic Transduction Materials and Devices & Workshop on Piezoelectric Force Microscopy (IEEE, May 2014), pp. 1-3.

(Continued)

*Primary Examiner* — Min Huang
(74) *Attorney, Agent, or Firm* — Kenneth Liu; Charles A. Brill; Frank D. Cimino

(57) ABSTRACT

A method of setting the reference voltage for sensing data states in integrated circuits including ferroelectric random access memory (FRAM) cells of the one-transistor-one capacitor (1T-1C) type. In an electrical test operation, some or all of the FRAM cells are programmed to a particular polarization state. A "shmoo" of the reference voltage for sensing the data state is performed, at one or more worst case electrical or environmental conditions for that data state, to determine a reference voltage limit at which the weakest cell fails to return the correct data when read. A configuration register is then written with a reference voltage based on this reference voltage limit, for example at the limit plus/minus a tolerance.

22 Claims, 6 Drawing Sheets

(56) References Cited

U.S. PATENT DOCUMENTS

| | | | |
|---|---|---|---|
| 2005/0213419 A1* | 9/2005 | Miyamoto | G11C 14/0072 365/230.03 |
| 2005/0251617 A1* | 11/2005 | Sinclair | G06F 3/061 711/103 |
| 2011/0085369 A1 | 4/2011 | Rodriguez | |
| 2013/0051164 A1* | 2/2013 | Chang | G11C 11/5685 365/189.16 |
| 2013/0194883 A1* | 8/2013 | Lee | G11C 29/04 365/201 |
| 2014/0029326 A1 | 1/2014 | Qidwai | |
| 2014/0052940 A1* | 2/2014 | Gurgi | G06F 12/00 711/154 |
| 2014/0108747 A1* | 4/2014 | Seol | G06F 12/00 711/154 |
| 2015/0287455 A1* | 10/2015 | Park | G11C 13/004 365/148 |
| 2015/0357050 A1* | 12/2015 | Bailey | G11C 29/50016 365/145 |
| 2016/0148703 A1* | 5/2016 | Kim | G11C 16/26 365/185.11 |

OTHER PUBLICATIONS

Tanaka et al., "FRAM Cell Design with High Immunity to Fatigue and Imprint for 0.5 um 3V 1T1C 1M bit FRAM", Digest of Technical Papers, International Electron Device Meeting, paper 13.4.1 (IEEE, 1998), pp. 359-362.

Ogiwara et al., "A 0.5 um, 3-V, 1T1C, 1-Mbit FRAM with a Variable Reference Bit-Line Voltage Scheme using a Fatigue-Free Reference Capacitor", J. Solid State Circ., vol. 35, No. 4 (IEEE, 2000), pp. 545-551.

Rodriguez et al., "Reliability Properties of Low-Voltage Ferroelectric Capacitors and Memory Arrays", Trans. on Device and Materials Reliability, vol. 4, No. 3 (IEEE, 2004), pp. 436-449.

Rodriguez et al., "Reliability of Ferroelectric Random Access Memory Embedded within 130 nm CMOS", International Reliability Physics Symposium, (IEEE, 2010), pp. 750-758.

Acosta et al., "Scaling reliability and modeling of ferroelectric capacitors", International Reliability Physics Symposium, (IEEE, 2010), pp. 689-693.

Sharroush, "1T-1C FRAM cell reading without reference-voltage generation," Japan-Egypt International Conference on Electronics, Communications and Computers (IEEE, 2013), pp. 40-45.

Glazewski et al., "FRAM sense amplifier with compensation for random and systematic offset," 6th International Memory Workshop (IEEE, 2014), pp. 1-4.

Jung et al., "Fatigue-Free Reference Scheme and Process-Induced Damage in a 1T1C FRAM", J. Korean Physical Soc., vol. 39, No. 1 (2001), pp. 80-86.

Kim et al., "Analysis of Static Imprint Phenomenon in Ferroelectric VDF-TRFE Copolymer Film for Nonvolatile Memory Devices", J. Korean Physical Soc., vol. 57, No. 6 (2010), pp. 1690-1694.

Kawashima et al., "A Reliable 1T1C FeRAM Using a Thermal History Tracking 2T2C Dual Reference Level Technique for a Smart Card Application Chip", IECE Trans. Electron., vol. E90-C, No. 10 (2007), pp. 1941-1948.

U.S. Appl. No. 14/857,873, filed Sep. 18, 2015.

\* cited by examiner

SETTING OF REFERENCE VOLTAGE FOR DATA SENSING IN FERROELECTRIC MEMORIES

CROSS-REFERENCE TO RELATED APPLICATIONS

This application claims priority, under 35 U.S.C. §119(e), of Provisional Application No. 62/116,977, filed Feb. 17, 2015, incorporated herein by this reference.

STATEMENT REGARDING FEDERALLY SPONSORED RESEARCH OR DEVELOPMENT

Not applicable.

BACKGROUND OF THE INVENTION

This invention is in the field of non-volatile memory integrated circuits. Embodiments of this invention are more specifically directed to the setting of an operational parameter in ferroelectric memory devices.

Conventional metal-oxide-semiconductor (MOS) and complementary MOS (CMOS) logic and memory devices are prevalent in modern electronic systems, as they provide an excellent combination of fast switching times and low power dissipation, along with their high density and suitability for large-scale integration. As is fundamental in the art, however, those devices are essentially volatile, in that logic and memory circuits constructed according to these technologies do not retain their data states upon removal of bias power. Especially in mobile and miniature systems, the ability to store memory and logic states in a non-volatile fashion is very desirable. As a result, various technologies for constructing non-volatile devices have been developed in recent years.

One non-volatile solid-state memory technology involves the construction of capacitors in which the dielectric material is a polarizable ferroelectric material, such as lead zirconate titanate (PZT) or strontium-bismuth-tantalate (SBT). Hysteresis in the charge-vs.-voltage (Q-V) characteristic of these ferroelectric capacitors enables the non-volatile storage of binary states after voltage has been removed from the capacitor plates, with the stored state corresponding to the polarization state of the ferroelectric material. In contrast, conventional MOS capacitors lose their stored charge upon removal of the capacitor voltage. It has been observed that ferroelectric capacitors can be constructed by processes that are largely compatible with modern CMOS integrated circuits, for example by placing capacitors above the transistor level and below the metal conductor levels.

FIG. 1 illustrates an example of a Q-V characteristic of a conventional ferroelectric capacitor. As shown, the charge (Q) stored across the conductive plates depends on the voltage applied to the plates (V), and also on the recent history of that voltage. If the voltage V applied across the capacitor plates exceeds a "coercive" voltage $+V_\alpha$, the capacitor polarizes into the "+1" state. According to this characteristic, once polarized to the "+1" state, so long as voltage V remains above coercive voltage $-V_\beta$, the capacitor exhibits a stored charge of $+Q_1$. Conversely, if the voltage V applied across the capacitor plates is more negative than coercive voltage $-V_\beta$, the capacitor is polarized into the "-1" state, and will exhibit a stored charge of $-Q_2$ for applied voltage V below $+V_\alpha$.

An important characteristic of ferroelectric capacitors, as used in non-volatile solid-state memory, is the difference in capacitance exhibited by a ferroelectric capacitor between its polarized states. As fundamental in the art, the capacitance of an element refers to the ratio of stored charge to applied voltage. While the ferroelectric capacitor has a linear capacitance by virtue of its construction as parallel plates separated by a dielectric film (i.e., the ferroelectric material), it also exhibits significant polarization capacitance (i.e., charge storage) in response to changes in polarization state that occurs upon application of a polarizing voltage. For example, referring to FIG. 1, the polarization of a ferroelectric capacitor from its "-1" state to its "+1" state is reflected in a relatively high capacitance C(-1), reflecting the storage of polarization charge in the capacitor in response to the change of polarization state by the voltage exceeding coercive voltage $V_\alpha$. On the other hand, a capacitor that already in its "+1" state exhibits little capacitance C(+1) due to polarization, since its ferroelectric domains are already aligned in the direction of the applied coercive voltage, causing little additional polarization charge to be stored.

This ferroelectric behavior is being put to use in non-volatile ferroelectric read/write random access memory (RAM) devices, commonly referred to as "ferroelectric RAM", or "FeRAM", or "FRAM" devices. FRAMs are now commonplace in many electronic systems, particularly portable electronic devices and systems, and are especially attractive in implantable medical devices such as pacemakers and defibrillators. Various memory cell architectures including ferroelectric capacitors are known in the art, including the well-known 2T-2C (two transistor, two capacitor) cells in which the two ferroelectric capacitors in a cell are polarized to complementary states, with the polarity of that complementary polarization indicating the stored data state. As known in the art, the complementary polarized states of the 2T-2C cell present a differential signal to a pair of bit lines, in a read operation. This differential signal at the bit line pair is sensed by a differential sense amplifier in conventional memory architectures, to retrieve the stored data state.

Another known arrangement of a ferroelectric memory cell is the 1T-1C (one transistor, one capacitor) arrangement. The 1T-1C cell is attractive because of the small chip area required for this cell as compared with 2T-2C and larger (e.g., 6T) FRAM cell types. However, as will be described in further detail below, the sensing of 1T-1C FRAM cells is necessarily single-ended, and thus provides significantly less read margin than does the differential sensing of 2T-2C cells.

FIG. 2a illustrates a typical arrangement of a conventional 1T-1C FRAM cell $2_{jk}$, which represents a single cell residing in a row j and a column k of an array of similar cells 2. Cell $2_{jk}$ includes n-channel pass transistor 4 and ferroelectric capacitor 6. The source/drain path of transistor 4 is connected between bit line $BL_k$ for column k of the array, and the top plate of ferroelectric capacitor 6; the gate of transistor 4 is controlled by word line $WL_j$ for row j of the array. The bottom plate of ferroelectric capacitor 6 is connected to plate line PL, which may be in common for all cells 2 in the array (or in a particular portion of the array, depending on the architecture). As such, 1T-1C FRAM cells are constructed similarly as conventional dynamic RAM memory cells. Sense amplifier 8 is coupled to bit line $BL_k$, and operates to compare the bit line voltage developed by read current $i_R$ to a reference voltage $V_{REF}$ generated by reference voltage generator circuit 9, as will be described below.

As typical in the art for 1T-1C memory cells such as cell $2_{jk}$ of FIG. 2a, the polarization state that exhibits the higher capacitance when sensed, which in this case is the "−1" polarization state, will be considered as the "1" data state, and the lower capacitance "+1" polarization state will be considered as the "0" data state. Cell $2_{jk}$ is written by applying voltages to plate line PL and bit line $BL_k$ that, with word line $WL_j$ energized, polarizes capacitor 6 into the desired polarization state. In this example, a "0" data state corresponding to the "+1" polarization state of FIG. 1 is written by the application of a low voltage ($V_{ss}$) to bit line $BL_k$, turning on word line $WL_j$, and then raising plate line PL to a high voltage ($V_{cc}$). Conversely, a "1" data state corresponding to the "−1" polarization state is written by the application of a low voltage ($V_{ss}$) to plate line PL, turning on word line $WL_j$, and then raising bit line $BL_k$ to a high voltage ($V_{cc}$).

The read operation of cell $2_{jk}$ begins with the precharging of bit line $BL_k$ to a low voltage (e.g., $V_{ss}$). As shown in FIG. 2b, once bit line $BL_k$ is precharged, word line $WL_j$ is energized to turn on transistor 4 and couple capacitor 6 to bit line $BL_k$. The voltage of plate line PL from the low voltage $V_{ss}$ is then raised to the high voltage $V_{cc}$ to interrogate the polarization capacitance of capacitor 6, according to the hysteresis diagram of FIG. 1. Specifically, the energizing of plate line PL induces a read current $i_R$ onto bit line $BL_k$ to develop a voltage on bit line $BL_k$. As known in the art, the voltage level developed on bit line $BL_k$ depends on the capacitance exhibited by ferroelectric capacitor 6 in cell $2_{jk}$ relative to the bit line capacitance. As shown in FIG. 2b, if capacitor 6 is in the "+1" polarization state, read current $i_R$ will be relatively low and will thus develop a relatively low level bit line voltage V(0). Conversely, the "−1" polarization state of capacitor 6 will result in a relatively strong read current $i_R$, and higher level voltage V(1) at bit line $BL_k$.

According to an "after-pulse sensing" approach as shown in FIG. 2b, sense amplifier 8 is activated at time $t_{SA\_ap}$, after the plate line PL pulse, at which time sense amplifier 8 compares the bit line voltage with the reference voltage $V_{REF}$ from reference voltage generator 9. To discern the stored data state, reference voltage $V_{REF}$ is set at a nominal voltage between the expected low and high data state levels V(0), V(1), respectively (i.e., within the window $\Delta V$ of FIG. 2b). Following time $t_{SA\_ap}$, sense amplifier 8 drives bit line $BL_k$ to a full logic "1" level in response to detecting the higher bit line voltage V(1), and to a full logic "0" level in response to detecting the lower bit line voltage V(0), as shown in FIG. 2b.

Another conventional sense approach, referred to as "step sensing" or "on-pulse sensing" activates sense amplifier 8 during the plate line pulse, such as at time $t_{SA\_op}$ shown in FIG. 2b. As known in the art and as shown in FIG. 2b, the bit line voltages V(0), V(1) exhibit a lower common mode voltage in the after-pulse sensing case, because the non-switching capacitance of the data "0" state does not contribute to the sensed voltage. After-pulse sensing is preferred in many implementations, to minimize the effect of variations in the non-switching capacitance of the ferroelectric capacitor on the bit line voltage.

In either case, the read of the "1" data state is destructive, because the read operation essentially programs cell $2_{jk}$ into the opposite data state; a write-back operation (not shown in FIG. 2b) is then typically performed to return cell $2_{jk}$ to its previous polarization state.

As evident from the foregoing description, the read signal from 1T-1C FRAM cell $2_{jk}$ is single-ended, and is sensed by comparison with a reference level such as reference voltage $V_{REF}$. In contrast, 2T-2C FRAM cells provide a differential signal to the sense amplifier, where the data state is indicated by the polarity of the complementary bit line voltages from the cell. As such, and as mentioned above, read margin is a significant issue with 1T-1C FRAM cells.

FIG. 3 illustrates an example of cumulative bit fail distributions with reference voltage for a conventional 1T-1C FRAM memory, for both data states. Curves $10_0$ and $10_1$ respectively indicate the numbers of "0" data state bits and "1" data state bits that fail at various reference voltages $V_{REF}$ (expressed in reference units relative to the reference voltage at which the strongest "0" cell fails). As evident to those skilled in the art from FIG. 3, lower reference voltages $V_{REF}$ will be more difficult for "0" data states and easier for "1" data states to be correctly read, and higher reference voltages $V_{REF}$ will be more difficult for "1" data states and easier for "0" data states to be correctly read. Stated another way, movement of reference voltage $V_{REF}$ in one direction will improve the read margin for one data state, but will reduce the read margin for the other data state. Accordingly, conventional FRAM memories typically set the level of their reference voltage $V_{REF}$ for normal operation at a voltage that is equidistant from the level at which the weakest "0" cell fails and the level at which the weakest "1" cell fails, in order to maximize the worst case read margin. As shown in FIG. 3, reference voltage $V_{REF}$ is set at a level that is $\Delta/2$ above the "0's limit" at which the weakest "0" cell fails and $\Delta/2$ above the "1's limit" at which the weakest "1" cell fails, where 4 is the difference between the 0's limit and the 1's limit. In practice, this mid-point reference voltage level is typically set during electrical test of each device, for example by programming a configuration register or the like based on test results of the cells in each device at varying reference voltages.

By way of further background, copending and commonly assigned U.S. Patent Application Publication US 2015/0357050, incorporated herein by reference, describes a data retention reliability screen of FRAM cells in which a reference voltage level for the read of a high polarization capacitance data state (e.g., a "1" state) is determined for each integrated circuit being tested. A number of FRAM cells in the integrated circuit are programmed to the "1" data state, and then read at an elevated temperature. The number of failing cells is compared against a pass/fail threshold to determine whether that integrated circuit is vulnerable to long-term data retention failure.

By way of further background, copending and commonly assigned U.S. application Ser. No. 14/857,873, filed Sep. 18, 2015 and incorporated herein by reference, describes a data retention reliability screen of FRAM memory arrays in which sampled groups of cells are tested at varying reference voltage levels, after programming to the high polarization capacitance state and after a relaxation pause at an elevated temperature. A test reference voltage is derived from fail bit counts of the sample groups for use in testing all of the FRAM cells in the integrated circuit.

BRIEF SUMMARY OF THE INVENTION

Disclosed embodiments provide a method of setting a read reference voltage in integrated circuits including ferroelectric memory cells of the one-transistor one-capacitor (1T-1C) type so as to maintain optimum read margin over the operating life of the device.

Disclosed embodiments provide such a method that can be implemented without significant additional manufacturing test time.

Disclosed embodiments provide such a method that can be performed on integrated circuits in either packaged form or wafer form.

Disclosed embodiments provide such a method that can be implemented without necessitating changes to the design of the ferroelectric memory.

Other objects and advantages of the disclosed embodiments will be apparent to those of ordinary skill in the art having reference to the following specification together with its drawings.

According to certain embodiments, a method of setting an integrated circuit including an array of ferroelectric memory cells of the 1T-1C type is implemented during a test sequence. A plurality of memory cells are programmed to a first data state corresponding to the lower polarization capacitance state, and are read at varying reference voltages under worst case conditions for that data state, to determine a first limit at the reference voltage at which the first cell or cells fail. A reference voltage for use in normal operation is then set at a level at or near to the first limit.

BRIEF DESCRIPTION OF THE SEVERAL VIEWS OF THE DRAWING

FIG. 2b is a timing diagram illustrating the operation of a read of the 1T-1C ferroelectric memory cell of FIG. 2a.

DETAILED DESCRIPTION OF THE INVENTION

The one or more embodiments described in this specification are implemented into the manufacturing testing of ferroelectric random access memories (FRAMs) of the one-transistor one-capacitor (1T-1C) bit cell type, as it is contemplated that such implementation is particularly advantageous in that context. However, it is also contemplated that concepts of this invention may be beneficially applied to other applications, for example to integrated circuits including ferroelectric elements of other types beyond memory cells. Accordingly, it is to be understood that the following description is provided by way of example only, and is not intended to limit the true scope of this invention as claimed.

Figure 2A:
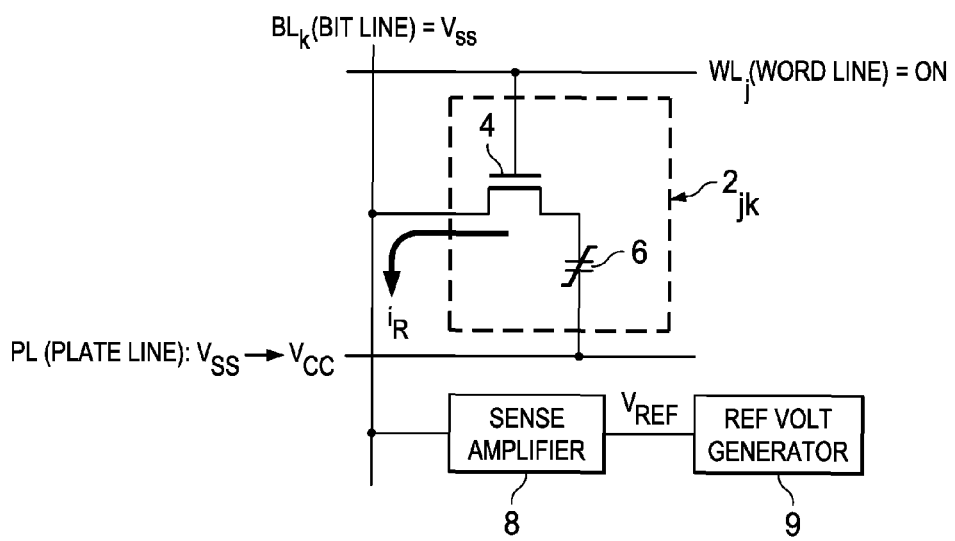
FIG. 2a is an electrical diagram, in schematic and block form, illustrating a conventional 1T-1C ferroelectric memory cell and its operation.
Figure 2B:
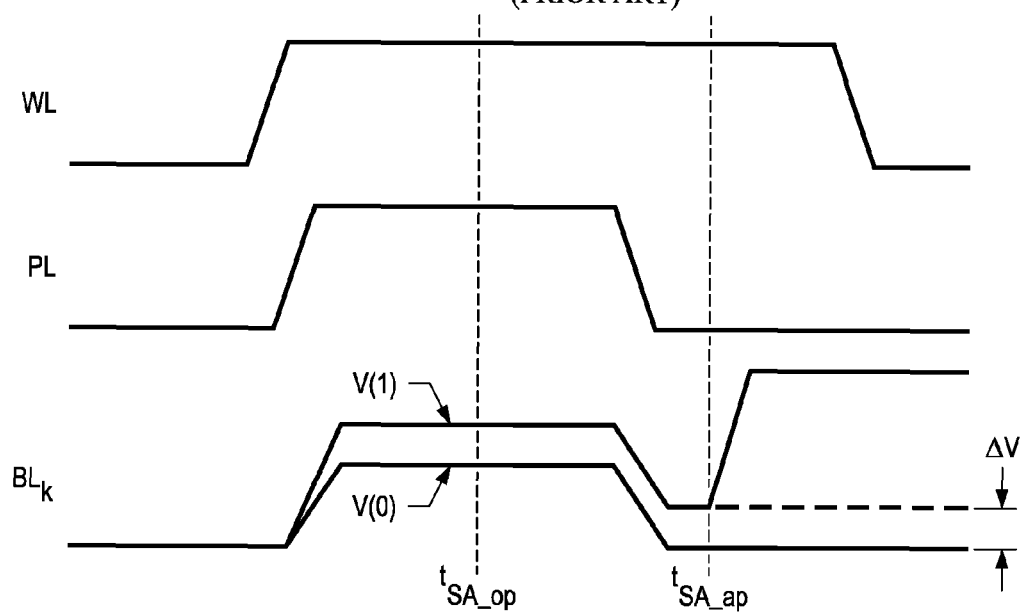

It has been observed from long-term reliability testing, such as by way of a high temperature bake, that ferroelectric capacitors are vulnerable to depolarization over time. This depolarization is believed to be due to non-uniformity of the hydrogen barrier films or variations in hydrogen exposure over the device population, resulting in infiltration of hydrogen into ferroelectric material and thus degradation in the hysteresis characteristic of ferroelectric capacitors incorporating that material. In FRAM memory applications, this depolarization is exhibited by weakened data retention for the polarization state that exhibits higher polarization capacitance when sensed by application of the sensing voltage. In the case of conventional FRAM read operation as discussed above relative to FIGS. 2a and 2b, the higher capacitance ("−1") polarization state corresponds to the "1" data state of FRAM cell $2_{jk}$, such that weakened data retention will appear as degraded read margin for stored "1" data values. 2T-2C FRAM cells are less susceptible to this type of data retention failure than are 1T-1C FRAM cells, because of the differential sensing of the complementary bit line voltages produced by 2T-2C cells as discussed above. Indeed, it is believed that this data retention vulnerability continues to limit the use of 1T-1C FRAM memories in many system applications.

Figure 4:
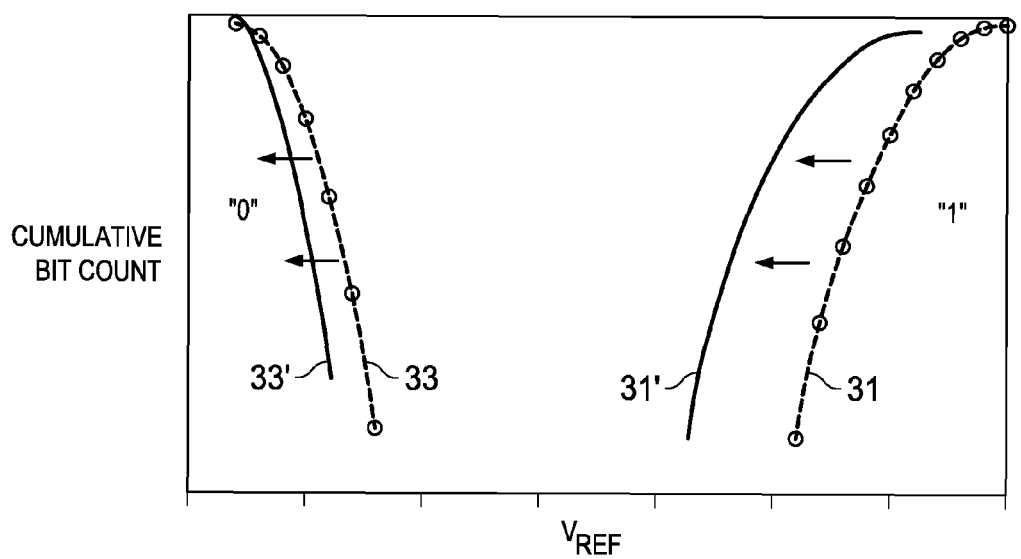
FIG. 4 illustrates plots of cumulative bit fail distribution for 1T-1C FRAM cells versus reference voltage level at the time of manufacture and also after an accelerated operating life test.
Figure 3:
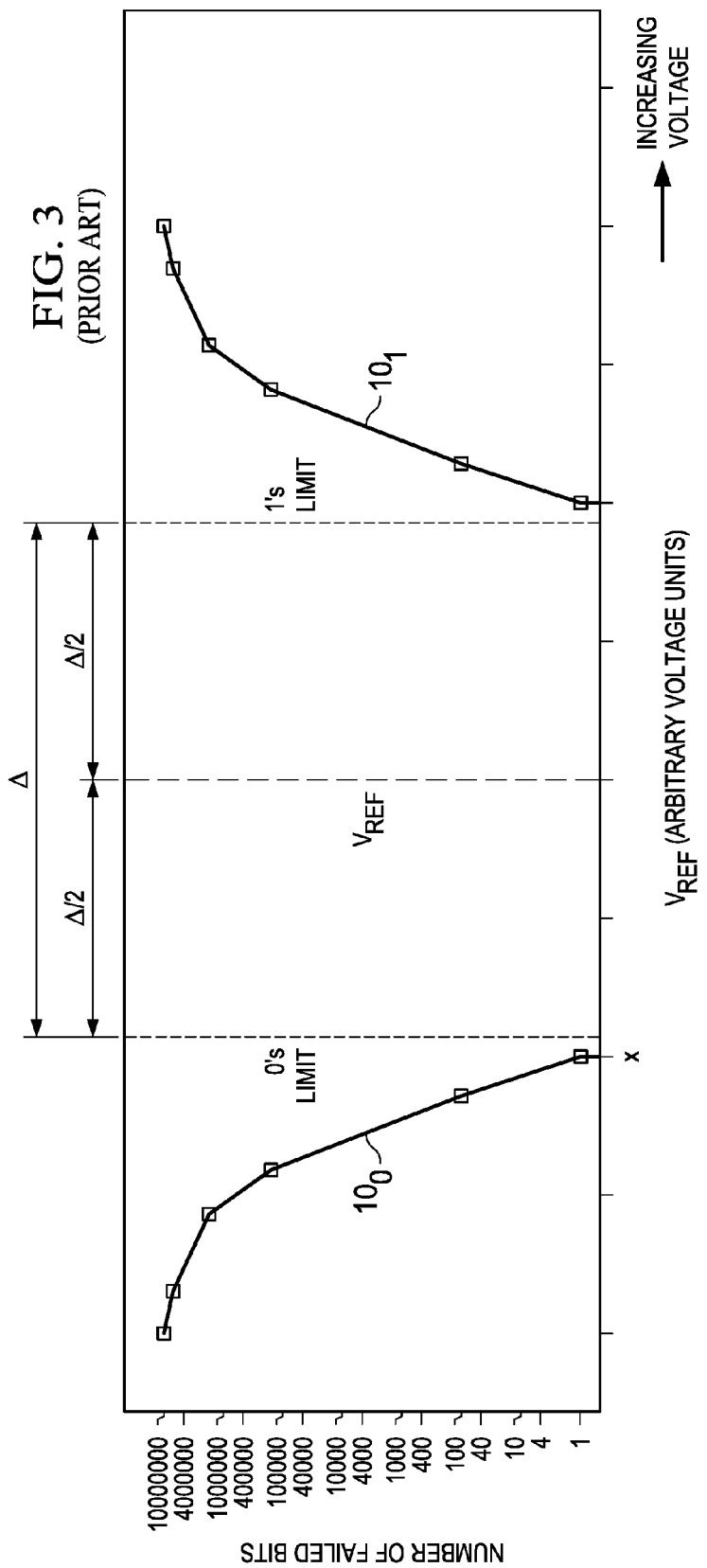
FIG. 3 illustrates plots of cumulative bit fail distribution for a ferroelectric random access memory (FRAM) of the 1T-1C type versus reference voltage level.

FIG. 4 illustrates the behavior of this mechanism of read margin degradation for an array of FRAM cells $2_{jk}$ as described above relative to FIGS. 2a and 2b. The plots of FIG. 4 are in the form of plots of a cumulative failed bit count with varying levels of reference voltage $V_{REF}$ generated by reference voltage generator circuit 9 and applied to sense amplifier 8 of FIG. 2a in the read operation in which "after-pulse" sensing is used, for the "0" and "1" programmed data states and before and after a long term data retention bake. Specifically, plot 31 illustrates the cumulative number of bits in the array that are programmed to a "1" data state and, when read at time-zero (i.e., prior to a data retention bake), return an incorrect "0" data value over varying reference voltage levels $V_{REF}$. For this data state, of course, higher reference voltage $V_{REF}$ levels cause more bits to fail, with the weakest bit failing at the lowest reference voltage $V_{REF}$. Similarly, plot 33 illustrates cumulative failed bits for the same array for the "0" data state, prior to a data retention bake; for this data state, the weakest bit fails at the highest reference voltage $V_{REF}$ level.

Plots 31', 33' illustrate the change in cumulative failed "1" and "0" data state bits, respectively, for the same population of FRAM cells following a data retention bake of 1000 hours at 125 deg C. As known in the art, this data retention bake is an accelerated measurement of the expected data retention reliability of the FRAM over its operating life. As evident from the shift from plot 31 to plot 31' in FIG. 4, this data retention bake resulted in the "1" data state cumulative fail bit count shifting to lower levels of reference voltage $V_{REF}$, indicating weakened data retention and reduced read margin for this data state. Conversely, plot 33' shows, relative to time-zero plot 33, that the cumulative failed count for the "0" data state also shifts to lower levels of reference voltage $V_{REF}$; however, this shift actually improves the read margin of 1T-1C cells for the "0" data state.

It has thus been observed, in connection with this invention, that the level of reference voltage $V_{REF}$ for a memory using 1T-1C FRAM cells, can be set more closely to the "'0' limit" at which the weakest "0" cell fails without risking additional bit failures due to depolarization effects during system life. Even though the "0" data state read margin is reduced according to this approach, that read margin will typically improve over time, while provide significant additional margin for "1" data state cells and thus improve the overall data retention reliability of the FRAM device.

Figure 5:
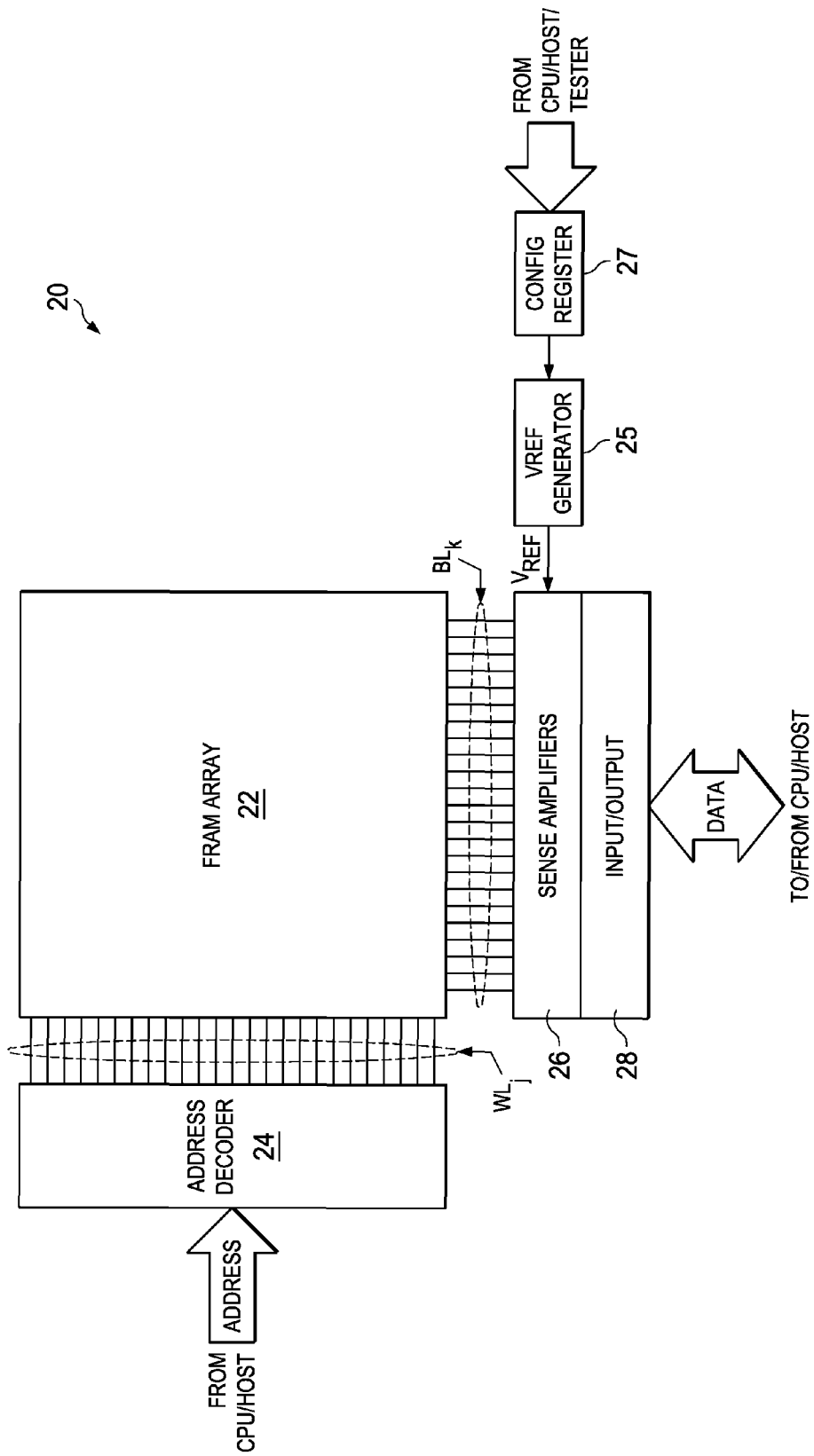
FIG. 5 is an electrical diagram, in block form, of an FRAM according to an embodiment.

Referring now to FIG. 5, the architecture of a ferroelectric random access memory (FRAM) 20 constructed in which embodiments of this invention may be implemented will now be generally described. In this example, FRAM 20 is shown as a stand-alone ferroelectric memory device. It is also contemplated that FRAM 20 may alternatively be integrated into a large-scale logic device such as a microprocessor, single-chip microcomputer, or a so-called "system-on-a-chip". It is contemplated that those skilled in the art having reference to this specification will be readily able to realize FRAM 20 in such a larger-scale integrated circuit if desired, without undue experimentation.

In any case, FRAM 20 according to these embodiments includes FRAM array 22, in which an array of FRAM cells of the 1T-1C type, such as cell $2_{jk}$ described above in connection with FIGS. 2a and 2b, are arranged in rows and columns. FRAM array 22 may be arranged in FRAM 20 as a single memory block, as suggested by FIG. 5; alternatively, multiple memory blocks or arrays 22 may be realized within FRAM 20 and the integrated circuit in which it is implemented. In this architecture, FRAM cells in the same row j share a common word line $WL_j$, and FRAM cells in the same column k share a common bit line $BL_k$.

Address decoder 24, which may be of conventional construction, is provided in FRAM 20 to decode a memory address value from an external device, such as a central processing unit (CPU) or other host processor. In response to a row address portion of that memory address, address decoder 24 activates a selected word line $WL_j$ is activated as appropriate for the desired memory operation (read or write/programming). Bit lines $BL_k$ from array 22 are coupled to corresponding sense amplifiers 26, as described above in connection with FIG. 2b. In a general sense, input/output circuitry 28 is coupled to sense amplifiers 26, for communication of data between cells in array 22 and data bus DATA. Typically, input/output circuitry 28 receives select signals from address decoder 24 corresponding to a column address portion of the memory address, based upon which the data from selected bit lines $BL_k$ are forwarded (in read operations) or written (in write operations). Data bus DATA may be in communication with the host or CPU, as suggested by FIG. 5.

According to these embodiments, in read cycles, each of sense amplifiers 26 senses the voltage induced on its corresponding bit line $BL_k$ by the read current from an FRAM cell in that column and in the selected row. As described above in connection with FIG. 2b, this sensing is performed by comparing that bit line voltage with a reference voltage $V_{REF}$ from $V_{REF}$ generator 25, as shown in FIG. 5.

$V_{REF}$ generator 25 may be constructed in various ways according to these embodiments. According to one implementation, $V_{REF}$ generator 25 is constructed as a bank of n ferroelectric capacitors that are programmably polarized in similar manner as the FRAM cells, and that can be selectively connected in parallel with one another to produce the reference voltage forwarded sense amplifiers 26. More specifically, a bank of switches may be provided to allow selective connection of a subset of x of these n capacitors in parallel with one another, in response to the contents of configuration register 27 in this embodiment. Alternatively, $V_{REF}$ generator 25 may be constructed according to other approaches. Examples include the use of "dummy" memory cells with ferroelectric or non-ferroelectric capacitors, conventional voltage reference generator circuits, and other variable reference voltage circuits. Other examples are described in Ogiwara et al., "A 0.5-mm, 3-V, 1T1C, 1-Mbit FRAM with a Variable reference Bit-Line Voltage Scheme using a Fatigue-Free Reference Capacitor", *J. Solid State Circ.*, Vol. 35, No. 4 (IEEE, April 2000), pp. 545-51; and Jung et al., "Fatigue-Free Reference Scheme and Process-Induced Damage in a 1T1C FRAM", *J. Korean Phys. Soc.*, Vol. 39, No. 1 (July 2001), pp. 80-86; both incorporated herein by this reference.

In this embodiment, configuration register 27 may be constructed as a bank of FRAM cells, of either 1T-1C or 2T-2C construction as desired, that may be rewritten during the test or operation of FRAM 20, while retaining its contents through operating life (i.e., is non-volatile). Alternatively, configuration register 27 may be constructed in other ways, as known by those skilled in the art having reference to this specification. In these embodiments, it is contemplated that the contents of configuration register 27 may be set by a CPU, host processor, external test equipment, or some other data source. In addition, also according to these embodiments, it is contemplated that the reference voltage $V_{REF}$ applied to sense amplifiers 26 may be varied by CPU, host, external test equipment, or some other source during electrical test of FRAM 20, either via or by bypassing configuration register 27, so as to perform a "shmoo" of the fail bit count of the cells of array 22 with varying reference voltage $V_{REF}$ to be performed, as will be described below.

Figure 6A:
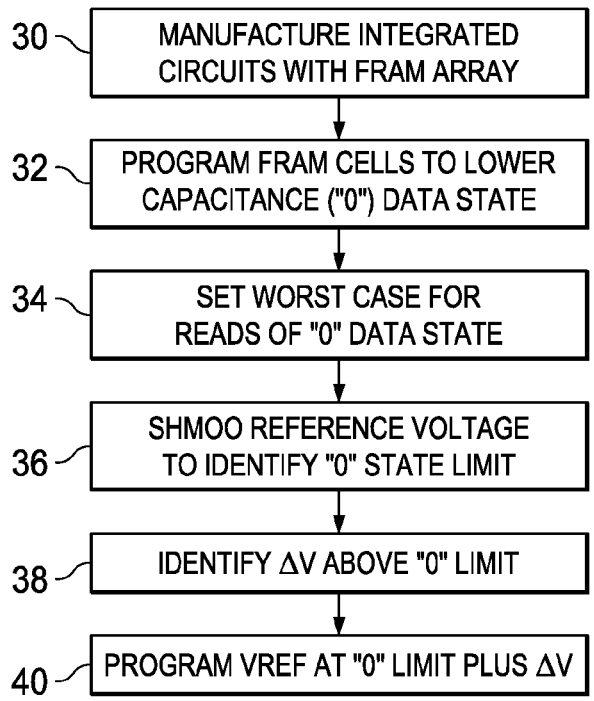
FIGS. 6a and 6b are flow diagrams illustrating a method of setting the operational reference voltage for the FRAM of FIG. 5 according to embodiments.
Figure 7A:
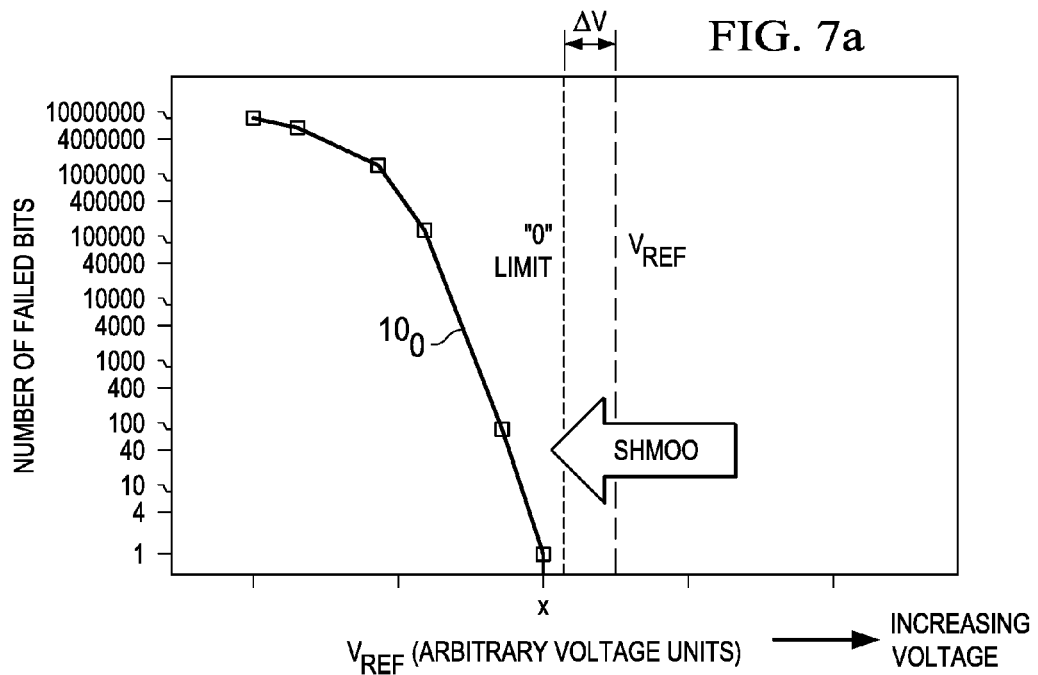
FIGS. 7a and 7b illustrate examples of the selection of the operational reference voltage relative to the plots of cumulative bit fail distribution of FIG. 4 according to the embodiments of FIGS. 6a and 6b, respectively.

Referring now to FIGS. 6a and 7a, a method of setting the level of reference voltage $V_{REF}$ in FRAM 20 according to an embodiment will now be described. In this example, the setting of reference voltage $V_{REF}$ is performed by the manufacturer at the final electrical test point for FRAM 20 in its manufacture. This ensures that the level of reference voltage $V_{REF}$ set by this method will be ready for normal operating use in the intended system environment. For the case in which the integrated circuits into which FRAM 20 is implemented are delivered in "chip" or wafer form for later assembly, the method of this embodiment may be performed at "multiprobe" electrical testing of the integrated circuits including FRAM 20 when in wafer form, as may be carried out using conventional electrical test equipment implemented at one or more conventional multiprobe test stations. For the case in which the integrated circuits are manufactured and delivered in packaged form, the method of this embodiment may be performed at the final electrical test of the packaged devices, again by conventional electrical test equipment. Further in the alternative, it is contemplated that the setting of reference voltage $V_{REF}$ in FRAM 20 may be enabled so as to be performed in the eventual system application if desired. In any case, referring to FIG. 6a, the method of this embodiment begins with process 30, in which integrated circuits including FRAM 20 are manufactured as desired, and are in the desired physical form for the setting of reference voltage $V_{REF}$.

It is further contemplated that the setting of reference voltage $V_{REF}$ in FRAM 20 according to this embodiment will be performed individually, for each instance of an FRAM array in a manufactured integrated circuit, or for each instance of $V_{REF}$ generator circuit 25 if supporting multiple FRAM arrays 22. This is because it is contemplated that the reference voltage $V_{REF}$ set according to this embodiment will likely vary from integrated circuit to integrated circuit, thus allowing each FRAM instance to be optimized with its best reference voltage $V_{REF}$ level. Alternatively, to save test time or for other reasons, it is contemplated that this method may be applied on a sample basis, with the results from one FRAM 20 being applied to others; however, it is contemplated that this approach may result in undue yield loss or less than optimal data retention performance.

In addition, it is contemplated that the particular processes carried out by the automated test equipment in the setting of reference voltage $V_{REF}$ in FRAM 20 according to this embodiment will be included as part of an overall functional and parametric electrical test program or sequence. In that regard, it is contemplated that the setting of reference voltage $V_{REF}$ will typically follow such testing as desired to ensure that FRAM 20 is fully functional and meets the desired specifications, including perhaps the enabling of redundant memory cells to replace otherwise failed cells. This testing may include multiple test insertions and sequences, including electrical testing at different temperatures.

Referring back to FIG. 6a, following the manufacture of FRAM 20 in process 30 and such other electrical testing as mentioned above, a population of FRAM cells in array 22 of FRAM 20 are programmed (i.e., written) in process 32 to the lower capacitance polarization state, which in the example described above corresponds to the "0" data state. While the population of FRAM cells programmed in process 32 may be a subset of the entirety of the FRAM cells in array 22, it is preferred that all FRAM cells in array 22 be programmed to the lower capacitance polarization state in this process 32, to optimize the setting of reference voltage $V_{REF}$.

In process 34, one or more electrical and environmental conditions corresponding to the worst case for reading the "0" (lower capacitance) data state from FRAM array 22 are set by or at the automated test equipment. For the case of FRAM 20 constructed as described above, the worst case for reads of the "0" data state include a temperature corresponding to the high temperature specification limit for FRAM 20 (e.g., above 30 deg C.), and the maximum power supply specification voltage for FRAM 20 (i.e., at maximum $V_{dd}$). The particular temperature and power supply voltage actually applied in process 34 will depend on the specification limits for the integrated circuit device including FRAM 20, and on such the appropriate "guardbands" and other adjustments to the specification limits used in electrical testing of the devices. In addition, the setting of the worst case for a parameter may be applied by way of a proxy; for example, when testing at room temperature, the power supply voltage may be increased by a selected increment beyond the specification limit for that voltage, to emulate the effect of a high ambient temperature at the specification limit. Other electrical or environmental conditions useful in arriving at the worst case for the read of the lower capacitance polarization state may additionally be set in process 34, as desired. The setting of some or all of these worst case conditions in process 34 may be applied prior to programming process 32, if desired.

In process 36, the automated test equipment is operated so as to "shmoo" reference voltage $V_{REF}$ as array 22 is read, in order to identify a "0" limit corresponding to the voltage at which the first (i.e., weakest) cell fails to return the programmed "0" level; conversely, the lowest reference voltage $V_{REF}$ at which all "0" cells will pass under expected conditions of voltage and temperature (i.e., which is incrementally higher than the voltage at which the first bit fails) may alternatively be considered as the "0" limit. As known in the art, a "shmoo" refers to a test operation that is repetitively performed at multiple values of one or more electrical parameters. In this embodiment, the parameter that is varied in shmoo process 36 is reference voltage $V_{REF}$ as generated by of $V_{REF}$ generator circuit 25 and applied to sense amplifiers 26 in FRAM 20 of FIG. 5, with the cells of array 22 being read at each reference voltage level. The manner in which reference voltage $V_{REF}$ is incrementally varied from one iteration to the next will of course depend on the construction and operation of $V_{REF}$ generator circuit 25. For the embodiment of FRAM 20 described above in which $V_{REF}$ generator circuit 25 is constructed as a bank of ferroelectric capacitors, the variation of reference voltage $V_{REF}$ is accomplished by selectively switching in (or out, as the case may be) one or more additional capacitors in each iteration to modulate the reference voltage $V_{REF}$ applied to sense amplifiers 26. In the example of FIG. 7a, each reference unit corresponds to an additional capacitance unit in $V_{REF}$ generator circuit 25, which is about 3.5 mV in this example.

As suggested in FIG. 7a, one example of the shmoo of process 36 varies reference voltage $V_{REF}$ incrementally lower from a high level at which all cells return a "0" level at least until the first cell fails the read, which is at a $V_{REF}$ of about 20 reference units in that Figure. In this example, the "0" limit is identified, in this process 36, as the reference voltage $V_{REF}$ of the first bit to fail the "0" data state read. Alternatively, the shmoo of process 36 may continue to vary reference voltage $V_{REF}$ to identify the numbers of cells failing at each successively lower level, so that the cumulative fail bit distribution (curve $10_0$ of FIG. 7a) is identified; in this approach, the "0" limit may be determined by extrapolation of the cumulative fail bit distribution rather than the actual level at which the first bit fails, if desired. However, continued shmooing past the first fail bit (i.e., the "0" limit) will require additional test time.

Preferably, all cells of FRAM 20 are read at each level of reference voltage $V_{REF}$ in shmoo test process 36, so that the true weakest bit in the device and the $V_{REF}$ level at which it failed can be most accurately identified. Alternatively, however, a subset of the cells of FRAM 20 may instead be read at each shmoo step, to save test time.

Upon process 36 determining the "0" limit at which the weakest "0" bit fails, the programmed level of reference voltage $V_{REF}$ is then determined according to this embodiment. Theoretically, the programmed reference voltage $V_{REF}$ may be set at an infinitesimally higher voltage than the "0" limit in this example, on the assumption that the "0" cells will become only stronger over system life as discussed above relative to FIG. 4. In a practical sense, however, it is useful to set reference voltage $V_{REF}$ at a voltage sufficiently higher than the "0" limit to provide some tolerance for variations in voltages among testers and system implementations, variations in temperature of the device, and the like. In particular, it has been observed that some level of randomness is present in the operation of sense amplifiers 26 in typical FRAM devices of the 1T-1C type, such that tolerance for random sense amplifier variations will also be useful in avoiding data read failures in operation. Based on one or more of these factors, a tolerance $\Delta V$ is identified for FRAM 20 in process 38. It is contemplated that this tolerance $\Delta V$ will be determined by way of characterization or otherwise, and applied to all FRAMs 20 of similar type and manufacture. As an example, a tolerance $\Delta V$ of on the order of 15 mV is considered to be suitable for modern 1T-1C FRAM devices. It has been observed that this tolerance $\Delta V$ will typically be at or below 20% of the voltage difference between the "0" limit and the "1" limit corresponding to the reference voltage $V_{REF}$ at which the weakest "1" bit fails, for example typically on the order of 10% of that difference. However, according to this embodiment, the programmed level of reference voltage $V_{REF}$ is not based on that difference, but rather is placed at a voltage that is as close to the "0" limit as practicable, given variations in sense amplifier performance, temperature, voltages, and the like.

In process 40 according to this embodiment, a level of reference voltage $V_{REF}$ corresponding to the $V_{REF}$ at the "0" limit plus the tolerance $\Delta V$ is programmed into FRAM 20 for its normal operation in system use. In FRAM 20 constructed as described above, this process 40 is performed by programming configuration register 27 with contents corresponding to the reference voltage $V_{REF}$ at the "0" limit plus the tolerance $\Delta V$. This reference voltage $V_{REF}$ will thus be the reference used by sense amplifiers 26 to carry out read operations in the normal operation of FRAM 20. The setting of reference voltage $V_{REF}$ is then complete, and additional testing or other processing of FRAM 20 may then be carried out as desired.

By programming the reference voltage $V_{REF}$ to a voltage that is at or near the level at which the weakest "0" cell will fail at time zero, under certain worst case conditions, this embodiment serves to maximize the read margin for FRAM cells at the higher capacitance ferroelectric state (e.g., the "1" data state in the embodiment described above). This allows greater tolerance for the loss of polarization that occurs in ferroelectric devices such as described above relative to FIG. 4, by allowing the "1" data state cells to shift to a greater extent before resulting in a data read failure. As discussed above, because the cumulative fail bit distribution for "0" data cells will tend to also shift to lower $V_{REF}$ levels over time, little risk due to reduced read margin of the "0" data state results from programming the reference voltage $V_{REF}$ close to the "0" limit at time zero. Accordingly, it is contemplated that the operating life performance of FRAM 20, from the standpoint of data retention, will be significantly improved according to this embodiment, without requiring changes in circuit design or manufacturing processes.

Figure 6B:
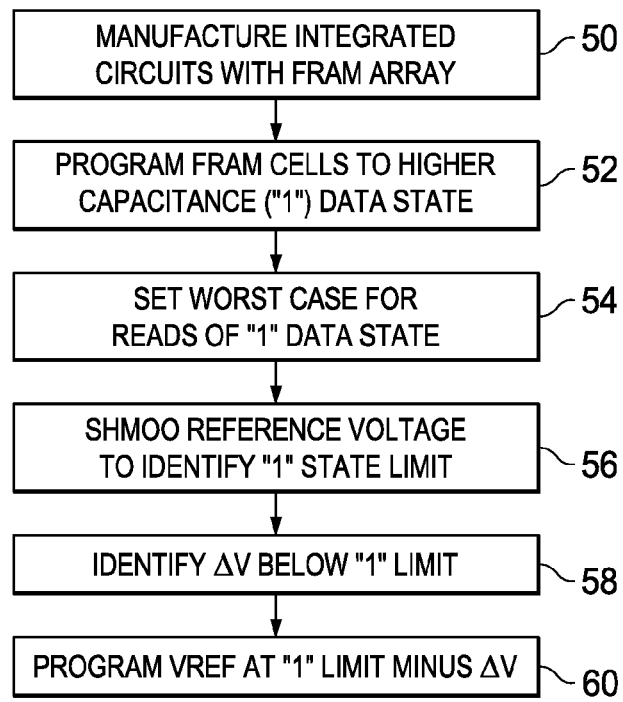

As described above, this embodiment is based on the realization that the fail bit distributions shift toward lower levels of reference voltage $V_{REF}$ over operating life, as shown in FIG. 4. This behavior was observed, in connection with this invention, for 1T-1C FRAM memories using "after-pulse" sensing, in which the sense amplifiers are activated after the completion of a pulse applied to the plate line, and where the ferroelectric material of the memory cells is PZT. However, the fail bit distributions may not necessarily shift in this same direction for other types of 1T-1C FRAM devices. For example, it is contemplated that some 1T-1C FRAMs that utilize "on-pulse" or "step sensing" in the read operations, in which the sense amplifiers are activated during the pulse at the plate line, and some 1T-1C FRAMs utilizing other ferroelectric materials or that are otherwise differently constructed from the examples described above, may exhibit shifts of the fail bit distributions over operating life toward higher levels of reference voltage $V_{REF}$. Accordingly, an alternative method of setting the level of reference voltage $V_{REF}$ in normal operation may be appropriate for those 1T-1C FRAM devices, as will now be described with reference to FIGS. 6b and 7b.

According to this embodiment, the method of setting reference voltage $V_{REF}$ corresponds generally to that described above in connection with FIG. 6a, but for the opposite data state, specifically the higher capacitance polarization state. As such, the integrated circuits including FRAM 20 are manufactured in process 50, and are subjected to the desired functional and parametric electrical test as desired. In process 52, some or all of the FRAM cells in array 22 are programmed, or written, to their higher capacitance polarization state. For the example of FRAM cells $2_{jk}$ described above relative to FIG. 2a, this higher capacitance polarization state is the "1" data state. As discussed above, it is desirable for all of the FRAM cells in array 22 to be programmed in process 52, to maximize the population size used to determine reference voltage $V_{REF}$; alternatively, only a subset of the cells may be programmed to save test time.

In process 54, a worst case for reading the higher capacitance ("1") data state is established for FRAM 20 is established for one or more electrical and environmental conditions. For FRAM 20 constructed as described above, the worst case for the read of the "1" data state is at a temperature corresponding to the low temperature specification limit for FRAM 20 (e.g., -30 deg C.) and the minimum power supply specification voltage (i.e., minimum $V_{dd}$). As before, the specific conditions that are set in process 54 will depend on the specification limits for FRAM 20, and may be either directly set or established using "guardbands" and other adjustments to the specification limits, or by way of a proxy that estimates the worst case condition (e.g., use of a power supply voltage level to emulate the effects of temperature). Other electrical or environmental conditions establishing the worst case for the read of the higher capacitance polarization state may also be set in process 54, if desired. This process 54 may be performed either prior to or after the programming of process 52, as appropriate for the test flow.

Figure 1:
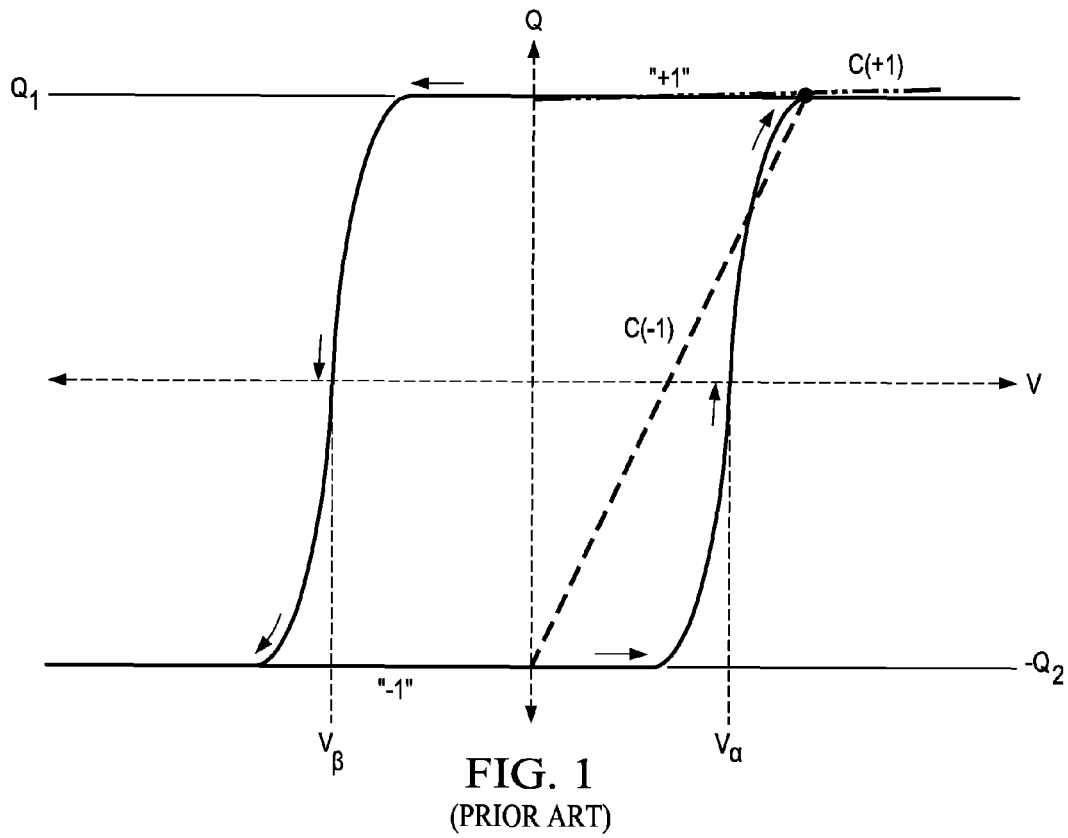
FIG. 1 is a plot of a charge-vs.-voltage characteristic of a conventional ferroelectric capacitor.
Figure 7B:
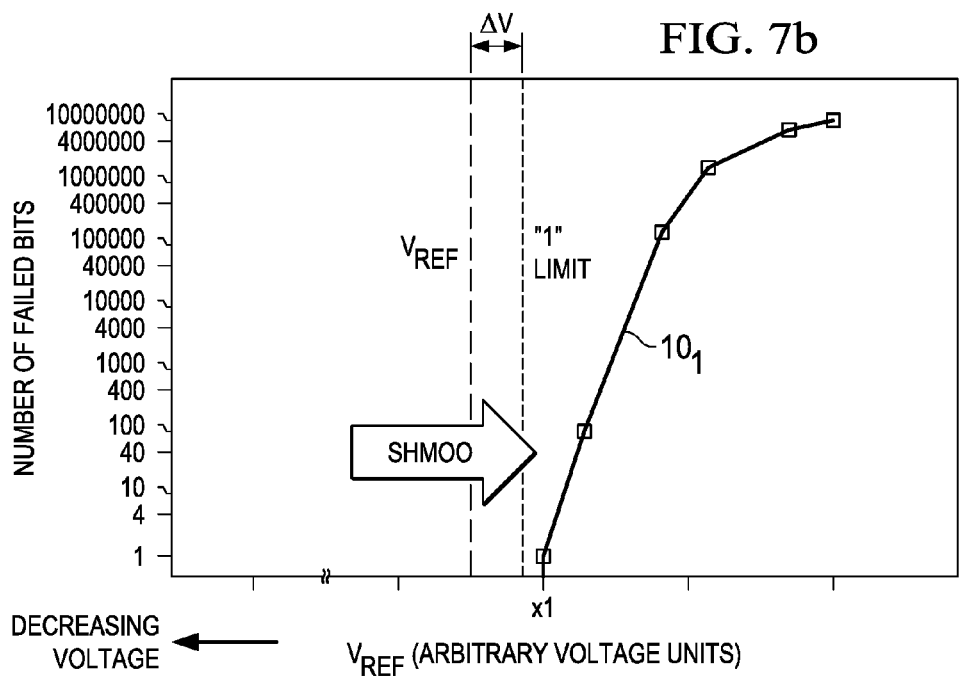

Once the one or more worst case conditions for this higher capacitance polarization state ("1" state) are set, the automated test equipment performs a shmoo of reference voltage $V_{REF}$ in process 56, to identify the limit of reference voltage $V_{REF}$ at which the first (i.e., weakest) cell fails to return the programmed "1" level in this example. This shmoo is performed by iteratively reading a population of the FRAM cells that are programmed to the "1" state, in this example, at varying levels of reference voltage $V_{REF}$ as generated by $V_{REF}$ generator circuit 25 and applied to sense amplifiers 26 in FRAM 20 of FIG. 5. As described above relative to FIG. 6a, the manner in which reference voltage $V_{REF}$ is incrementally varied from one iteration to the next will depend on the construction and operation of $V_{REF}$ generator circuit 25. FIG. 7b suggests an efficient implementation of shmoo of process 56 by incrementally increasing reference voltage $V_{REF}$ for each read of the programmed cells from a low level, at which all cells return a "1" data state, until the $V_{REF}$ level at which the first cell returns the incorrect data state. This $V_{REF}$ level at which the weakest cell fails to return the programmed "1" data state (or, conversely, the highest $V_{REF}$ level at which all FRAM cells return the correct data state) is indicated in FIG. 1b as the "'1' limit". Alternatively, as mentioned above, the shmoo of process 56 may identify this "1" limit by characterizing the cumulative fail bit distribution (curve $10_1$ of FIG. 7b) and extrapolating to estimate the $V_{REF}$ limit for the weakest bit.

Upon process 56 determining the "1" limit at which the weakest bit fails, the programmed level of reference voltage $V_{REF}$ is then determined according to this embodiment in processes 58 and 60. In process 58, a tolerance $\Delta V$ in the reference voltage $V_{REF}$ is identified for FRAM 20 to allow for variations in voltages among testers and system implementations, variations in temperature of the device, randomness in the operation of sense amplifiers 26, and the like. This tolerance $\Delta V$ reduces the likelihood of undue data read failures in normal operation of FRAM 20, while still providing excellent margin for the expected degradation in polarization over the life of the device. Again, it is contemplated that this tolerance $\Delta V$ will be determined by way of characterization or otherwise, and applied to all FRAMs 20 of similar type and manufacture. An example of tolerance $\Delta V$ for typical modern 1T-1C FRAM devices is on the order of 15 mV (e.g., at or below 20%, for example 10%, of the voltage difference between the "0" limit and the "1" limit). Again, according to this embodiment, the programmed level of reference voltage $V_{REF}$ is not based on the difference between the "0" limit and the "1" limit, but rather is placed at a voltage that is as close to the "1" limit as practicable, considering variations in sense amplifier performance, temperature, voltages, and the like.

In process 60 according to this embodiment, a level of reference voltage $V_{REF}$ corresponding to the $V_{REF}$ level of the "1" limit reduced by the tolerance ΔV identified in process 58, is programmed into FRAM 20 for its normal operation in system use. As described above, process 60 may be performed in the manner appropriate for the construction of configuration register 27, for example by programming configuration register 27 with contents corresponding to the reference voltage $V_{REF}$ at the "1" limit minus the tolerance ΔV. Once programmed, this reference voltage $V_{REF}$ is then applied to sense amplifiers 27 as the reference for discerning the data state of accessed FRAM cells in the normal operation of FRAM 20. Additional testing or other processing of FRAM 20 may then be carried out as desired.

In this embodiment, the setting of the reference voltage $V_{REF}$ to a voltage that is at or near the level at which the weakest "1" cell will fail at time zero, under certain worst case conditions, maximizes the read margin for FRAM cells at the higher capacitance ferroelectric state. This allows greater tolerance for the loss of polarization that occurs in ferroelectric devices in which the cumulative fail bit distributions of both data states shift toward higher levels of reference voltage $V_{REF}$, such as FRAM devices that utilize "on-pulse" sensing or constructed of alternative materials that exhibit this time-dependent behavior, by allowing the "0" data state cells to shift to a greater extent before resulting in a data read failure. As discussed above, because the cumulative fail bit distribution for "1" data cells in these types of devices will tend to also shift to higher $V_{REF}$ levels over time, little risk is introduced by reducing the read margin for the "1" data state. It is therefore contemplated that the operating life performance of FRAM 20, from the standpoint of data retention, will be significantly improved according to this embodiment, without requiring changes in circuit design or manufacturing processes.

According to these embodiments of the invention, it is contemplated that the data retention reliability of ferroelectric non-volatile memories of the 1T-1C type can be significantly optimized and improved, and thus the system life of these devices extended, at relatively little cost. In particular, this improvement in system life and reliability can be obtained without requiring changes in circuit design or in the physical manufacturing process, and without impacting electrical performance of the memories themselves. These embodiments may be implemented at any one of a number of stages of manufacture, or even as a retrofit in system use, depending on the architecture of the memory itself.

In addition, it is contemplated that the improved data retention reliability provided by these embodiments can enable the use of 1T-1C FRAM in critical applications that previously required 2T-2C FRAM. As a result, it is contemplated that these embodiments can greatly reduce the cost-per-bit of memory, enabling the use of non-volatile memory for functions and applications for which FRAM was previously cost-prohibitive or limited.

While one or more embodiments have been described in this specification, it is of course contemplated that modifications of, and alternatives to, these embodiments, such modifications and alternatives capable of obtaining one or more of the advantages and benefits of this invention, will be apparent to those of ordinary skill in the art having reference to this specification and its drawings. It is contemplated that variations on the embodiments described above will be apparent to those skilled in the art having reference to this specification, and that such variations are within the scope of the invention as claimed below. In particular, references to the "0" and "1" data states in this specification are made with reference to the particular arrangement of the FRAM as described, in that the "0" data state corresponds to the lower capacitance polarization state and the "1" data state corresponds to the higher capacitance polarization state, for the bias and sensing scheme described. In some implementations, the "1" data state will instead correspond to the lower capacitance polarization state, while the "0" data state corresponds to the higher capacitance state. Those skilled in the art having reference to this specification will comprehend that the data states will be reversed in such a case from those described above, and will be readily able to adapt the embodiments described herein to such opposite data states. It is contemplated that these and other modifications and alternatives are within the scope of this invention as subsequently claimed herein.

What is claimed is:

1. A method of setting a reference voltage in an integrated circuit including ferroelectric memory cells of the one transistor-one capacitor (1T-1C) type, comprising:
   programming a plurality of the ferroelectric memory cells to a first data state, the first data state corresponding to a lower capacitance polarization state than a second data state;
   iteratively reading the plurality of programmed ferroelectric memory cells at a plurality of reference voltage levels to identify a first reference voltage limit corresponding to the reference voltage level at which a weakest memory cell returns the second data state when read, wherein iteratively reading comprises:
      reading the plurality of ferroelectric memory cells at an initial reference voltage at which all of the ferroelectric memory cells return the first data state, the initial reference voltage level being a first voltage level of the plurality of reference voltage levels;
      then reading the plurality of ferroelectric memory cells at each of the remaining plurality of reference voltage levels by incrementally lowering the initial reference voltage until the first reference voltage limit is identified; and
      for each of the plurality of ferroelectric memory cells at each of the plurality of reference voltage levels:
         accessing the ferroelectric memory cell; and
         comparing a voltage produced by the ferroelectric memory cell in response to the accessing to the reference voltage level to determine whether the ferroelectric memory cell returns the first date state or the second data state; and
   configuring the integrated circuit to set the reference voltage at an operating level that is based upon the first reference voltage limit.

2. The method of claim 1, further comprising:
   prior to iteratively reading, setting an electrical parameter at a worst case condition for reading the first data state.

3. The method of claim 2, wherein setting the electrical parameter at the worst case condition comprises setting a power supply voltage at a level corresponding to a high power supply voltage specification limit.

4. The method of claim 1, further comprising:
prior to iteratively reading, setting an environmental parameter for the integrated circuit at a worst case condition for reading the first data state.

5. The method of claim 4, wherein setting the environmental parameter at the worst case condition comprises heating the integrated circuit to a temperature corresponding to a high temperature specification limit.

6. The method of claim 1, wherein accessing includes coupling a first plate of a ferroelectric capacitor in the ferroelectric memory cell to a bit line associated with the ferroelectric memory cell;
wherein the voltage produced by the ferroelectric memory cell in response to the accessing is provided on the bit line;
wherein the first data state corresponds to polarization of the ferroelectric capacitor to a first polarization state in which the capacitor retains a voltage of a first polarity in the absence of applied voltages; and
wherein accessing further includes:
applying a voltage pulse to the second plate of the ferroelectric capacitor; and
comparing the voltage at the bit line to the reference voltage level is performed after the voltage pulse.

7. The method of claim 1, wherein configuring the integrated circuit to set the reference voltage comprises:
writing the contents of a configuration register with a value corresponding to the operating level.

8. The method of claim 1, wherein the operating level is equal to the first reference voltage limit plus a tolerance.

9. The method of claim 1, wherein the integrated circuit is one of a plurality of similar integrated circuits formed in a single integrated circuit wafer;
wherein the programming, iteratively reading, and configuring steps are performed with the integrated circuit in wafer form.

10. The method of claim 1, wherein the integrated circuit is a packaged integrated circuit.

11. A method of setting a reference voltage in an integrated circuit including ferroelectric memory cells of the one transistor-one capacitor (1T-1C) type, comprising:
programming a plurality of the ferroelectric memory cells to a first data state, the first data state corresponding to a higher capacitance polarization state than a second data state;
iteratively reading the plurality of programmed ferroelectric memory cells at a plurality of reference voltage levels to identify a first reference voltage limit corresponding to the reference voltage level at which a weakest memory cell returns the second data state when read, wherein iteratively reading comprises:
reading the plurality of ferroelectric memory cells at an initial reference voltage at which all of the ferroelectric memory cells return the first data state, the initial reference voltage level being a first voltage level of the plurality of reference voltage levels;
then reading the plurality of ferroelectric memory cells at each of the remaining plurality of reference voltage levels by incrementally raising the initial reference voltage until the first reference voltage limit is identified; and
for each of the plurality of ferroelectric memory cells at each of the plurality of reference voltage levels:
accessing the ferroelectric memory cell; and
comparing a voltage produced by the ferroelectric memory cell in response to the accessing to the reference voltage level to determine whether the ferroelectric memory cell returns the first date state or the second data state; and
configuring the integrated circuit to set the reference voltage at an operating level that is based upon the first reference voltage limit.

12. The method of claim 11, further comprising:
prior to iteratively reading, setting an electrical parameter at a worst case condition for reading the first data state.

13. The method of claim 12, wherein setting the electrical parameter at the worst case condition comprises setting a power supply voltage at a level corresponding to a low power supply voltage specification limit.

14. The method of claim 11, further comprising:
prior to iteratively reading, setting an environmental parameter for the integrated circuit at a worst case condition for reading the first data state.

15. The method of claim 14, wherein setting the environmental parameter at the worst case condition comprises heating the integrated circuit to a temperature corresponding to a low temperature specification limit.

16. The method of claim 11, wherein accessing includes coupling a first plate of a ferroelectric capacitor in the ferroelectric memory cell to a bit line associated with the ferroelectric memory cell;
wherein the voltage produced by the ferroelectric memory cell in response to the accessing is provided on the bit line;
wherein the first data state corresponds to polarization of the ferroelectric capacitor to a first polarization state in which the capacitor retains a voltage of a first polarity in the absence of applied voltages; and
wherein accessing further includes
applying a voltage pulse to the second plate of the ferroelectric capacitor; and
comparing the voltage at the bit line to the reference voltage level is performed during the applying of the voltage pulse to the second plate of the ferroelectric capacitor.

17. The method of claim 11, wherein configuring the integrated circuit to set the reference voltage comprises:
writing the contents of a configuration register with a value corresponding to the operating level.

18. The method of claim 11, wherein the operating level is equal to the first reference voltage limit minus a tolerance.

19. The method of claim 11, wherein the integrated circuit is one of a plurality of similar integrated circuits formed in a single integrated circuit wafer;
wherein the programming, iteratively reading, and configuring steps are performed with the integrated circuit in wafer form.

20. The method of claim 11, wherein the integrated circuit is a packaged integrated circuit.

21. The method of claim 6, wherein coupling the first plate of the ferroelectric capacitor in the ferroelectric memory cell to the bit line associated with the ferroelectric memory cell comprises supplying a voltage to a word line associated with the ferroelectric memory cell to activate a transistor coupled between the bit line and the first plate of the ferroelectric capacitor.

22. The method of claim 1, wherein the voltage produced by the ferroelectric memory cell is compared to the reference voltage level using a sense amplifier.

* * * * *